United States Patent [19]
Chakradhar et al.

[11] Patent Number: 6,134,687
[45] Date of Patent: Oct. 17, 2000

[54] PERIPHERAL PARTITIONING AND TREE DECOMPOSITION FOR PARTIAL SCAN

[75] Inventors: Srimat Chakradhar, Old Bridge, N.J.; Arun Balakrishnan, Santa Clara, Calif.

[73] Assignee: NEC USA, Inc., Princeton, N.J.

[21] Appl. No.: 08/994,430

[22] Filed: Dec. 19, 1997

[51] Int. Cl.[7] .................................................. G01R 31/28
[52] U.S. Cl. .......................................... 714/726; 714/724
[58] Field of Search ..................................... 714/726, 724

[56] References Cited

U.S. PATENT DOCUMENTS

| | | | |
|---|---|---|---|
| 5,043,986 | 8/1991 | Agrawal et al. | 714/736 |
| 5,329,533 | 7/1994 | Lin | 714/726 |
| 5,461,573 | 10/1995 | Chakradhaer et al. | 364/489 |

OTHER PUBLICATIONS

Miron Abramovici, et al., "The Best Flip–Flops to Scan," International Test Conference 1991.
Kee S. Kim and Charles R. Kime, "Partial Scan by Use of Empirical testability," IEEE 1990.
Prashant S. Parikh and Miron Abramovici, "A Cost–Based Approach to Partial Scan," ACM/IEEE 1993.
Dong Xiang and Janak H. Patel, "A Global Algorithm for the Partial Scan Design Problem Using Circuit State Information," International Test Conference, IEEE 1996.
Vishwani D. Agrawal et al., "Designing Circuits with Partial Scan," 1987.
Vivek Chickermane and Janak H. Patel, "A Fault Oriented Partial Scan Design Approach," 1991.
Hi–Keung Tony Ma et al., "An Incomplete Scan Design Approach to Test Generation for Sequential Machines," International Test Conference 1988.
Insung Park et al., "A New Method for Partial Scan Design Based on Propagation and Justification Requirements of Faults," Internatioal Test Conference 1995.
Vamsi Boppana and W. Kent Fuchs, "Partial Scan Design Based on State Transition Modeling," International Test Conference 1996.
Chih–chang Lin et al., "Cost–Free Scan: A Low–Overhead Scan Path Design Methodology," IEEE 1995.
Chih–chang Lin et al., "Test–Point Insertion: Scan Paths Through Functional Logic," IEEE 1998.
Douglass Chang et al., "A Test Synthesis Approach to Reducing BALLAST DFT Overhead," 1997.
Rajesh Gupta et al., Correspondence,"The BALLAST Methodology for Structured Partial Scan Digest," IEEE 1990.
Kwang–Tint Cheng and Vishwani D. Agrawal, "A Partial Scan Method for sequential Circuits with Feedback," IEEE 1990.
D. H. Lee and S. M. Reedy, "On Determing Scan Flip–Flops in Partial–Scan Designs," IEEE 1990.
Arno Kunzmann and Hans–Joachim Wunderlich, "An Analytical Approach to the partial Scan Problem," Journal of Electronic Testin 1990.
Sudipta Bhawmik and Kwang–Ting Cheng, "Pascant: A Partial Scan and Test Generation System," Custom Integrated Circuits Conference 1991.
Shang–E Tai and Debashis Bhattacharya, "A Three–stage Partial Scan Design Method using the Sequential Circuit Flow Graph," IEEE 1994.

(List continued on next page.)

*Primary Examiner*—Phung M. Chung
*Attorney, Agent, or Firm*—Sughrue, Mion, Zinn, Macpeak & Seas, PLLC

[57] ABSTRACT

A method, system and a computer product for a new partial scan technique that incurs significantly less overhead than the full-scan technique and yet achieves very high test coverage in short CPU times are provided. Scan memory elements are selected so that the scanned circuit satisfies two key properties in the test mode. First, the scanned circuit has partitions that are peripherally interacting finite state machines (peripheral partitions). Second, the memory element dependency graph (S-graph) of each peripheral partition of the scanned circuit has a tree structure. An efficient for algorithm peripheral partitioning and tree decomposition is provided. The scan memory element selection algorithm iteratively partitions the S-graph into disjoint sub-graphs with the tree structure.

7 Claims, 18 Drawing Sheets

OTHER PUBLICATIONS

Srimat T. Chakradhar et al., "An Exact Algorithm For Selecting Partial Scan Flip–Flops."

Arun Balakrishnan and Srimat T. Chakradhar, "Sequential Circuits with Combination Test Generation Complexity," IEEE 1995.

Toshinobu Ono, "Selecting Partial Scan Flip–Flops for Circuit Partitioning," 1994.

Hyoung B. Min and William A. Rogers, "A Test Methodology for Finite State Machines Using partial scan Design," Journal of Electronic Testing 1992.

Wu–Tung Cheng and Tapan J. Chakraborty," Gentest, An Automates Test–Generation System for Sequential Circuits," IEEE 1989.

Srinivas Devadas, "A Synthesis and Optimization Procedure for Fully and easily testable Sequential Machines," IEEE 1989.

Xinghao Chen and Michael L. Bushnell, "Dynamic State and Objective Learning for Sequential Circuit Automatic Test Generation Using Decomposition Equivalence," IEEE 1994.

| CKT | FLIP-FLOPS | PIPELINE ||||| SELF-LOOP ACYCLIC |||||
|---|---|---|---|---|---|---|---|---|---|---|---|
| | | SCAN | FC | FE | CPU(S) | VEC | SCAN | FC | FE | CPU(S) | VEC |
| S13207 | 699 | 310 | 96.7 | 99.4 | 825 | 2320 | 59 | 40.3 | 64.0 | 32848 | 3779 |
| S38417 | 1636 | 1080 | 99.4 | 99.9 | 1869 | 5366 | 374 | 72.0 | 75.4 | 145703 | 6748 |

SCAN - NUMBER OF SCAN FLIP-FLOPS, FC - FAULT COVERAGE, FE - FAULT EFFICIENCY, CPU(s) - CPU SECONDS ON SUN ULTRASPARC, VEC - NUMBER OF VECTORS

FIG. 13

| CKT | FF | SCAN FF | | | | CPU(s) | | | |
|---|---|---|---|---|---|---|---|---|---|
| | | SLA | PPL | SD1 | SD2 | PPL | SLA | SD1 | SD2 |
| S838 | 32 | 0 | 32 | 24 | 23 | 0.0 | 0.0 | 0.0 | 0.0 |
| S1423 | 74 | 21 | 71 | 55 | 51 | 0.1 | 0.3 | 0.5 | 0.5 |
| S5378 | 179 | 30 | 30 | 59 | 38 | 0.1 | 0.1 | 0.2 | 0.2 |
| S9234 | 228 | 53 | 152 | 126 | 101 | 0.3 | 0.5 | 0.7 | 0.7 |
| S13207 | 669 | 59 | 310 | 185 | 142 | 0.1 | 0.2 | 0.9 | 0.9 |
| S15850 | 597 | 88 | 441 | 282 | 210 | 0.8 | 13.0 | 24.0 | 23.9 |
| S38417 | 1336 | 374 | 1080 | 760 | 680 | 0.8 | 12.3 | 108 | 109.1 |
| S38584 | 1452 | 292 | 1115 | 719 | 666 | 0.8 | 136.3 | 29.2 | 29.3 |

SLA-SELF-LOOP ACYCLIC, PPL- PIPELINE ACYCLIC,
SD1-TREE DECOMPOSITION, SD2-SEQUENTIAL RECONVERGENCE DECOMPOSITION

FIG. 14

| CKT | FC | FE | CPU(s) | VEC | TAT |
|---|---|---|---|---|---|
| S838 | 100.0 | 100.0 | 2 | 141 | 0.44 |
| S1423 | 99.0 | 100 | 3 | 284 | 1.08 |
| S5378 | 93.8 | 96.5 | 356 | 2094 | 0.98 |
| S9234 | 92.9 | 99.1 | 416 | 1561 | 1.76 |
| S13207 | 96.7 | 99.4 | 825 | 2320 | 2.08 |
| S15850 | 96.6 | 99.9 | 702 | 2847 | 1.80 |
| S35932 | 88.82 | 100.0 | 1503 | 443 | |
| S38417 | 99.4 | 99.9 | 1869 | 5366 | 1.66 |
| S38584 | 95.7 | 99.9 | 1276 | 3168 | 1.36 |

FIG. 15

FC-FAULT COVERAGE, FE-FAULT EFFICIENCY, CPU(s)-CPU SECONDS ON SUN ULTRASPARC, VEC-NUMBER OF VECTORS, TAT-TEST APPLICATION TIME (NORMALIZED TO SD1 CASE)

| CKT | FC | FE | CPU(s) | MAXP | MAXD | MAXT | VEC | TAT |
|---|---|---|---|---|---|---|---|---|
| S838 | 98.1 | 100.0 | 5 | 2 | 1 | 5 | 421 | 1.0 |
| S1423 | 98.6 | 99.9 | 8 | 8 | 3 | 6 | 337 | 1.0 |
| S5378 | 97.0 | 99.6 | 225 | 65 | 7 | 6 | 1135 | 1.0 |
| S9234 | 64.6 | 98.0 | 288 | 18 | 17 | 15 | 1069 | 1.0 |
| S13207 | 91.8 | 99.0 | 508 | 27 | 10 | 24 | 1863 | 1.0 |
| S15850 | 90.2 | 100.0 | 1156 | 14 | 13 | 29 | 2470 | 1.0 |
| S35532 | 88.8 | 100.0 | 1562 | 124 | 33 | 32 | 652 | 1.0 |
| S38417 | 97.8 | 99.9 | 2281 | 13 | 3 | 9 | 4589 | 1.0 |
| S38584 | 93.8 | 99.9 | 1355 | 34 | 19 | 18 | 3603 | 1.0 |

FIG. 16

FC-FAULT COVERAGE,FE-FAULT EFFICIENCY,CPU(S)- CPU SECONDS ON SUN ULTRASPARC,MAX P-MAX PARTITION SIZE,MAX D - MAX SEQUENTIAL DEPTH,MAX T-MAX TEST SEQUENCE LENGTH,VEC - NUMBER OF VECTORS,TAT-TEST APPLICATION TIME (NORMALIZED TO SD1 CASE)

| CKT | FC | FE | CPU(S) | MAXP | MAXD | MAXT | VEC | TAT |
|---|---|---|---|---|---|---|---|---|
| S838 | 97.9 | 99.9 | 6 | 2 | 1 | 12 | 448 | 1.02 |
| S1423 | 98.4 | 99.4 | 9 | 8 | 3 | 7 | 285 | 0.79 |
| S5378 | 93.9 | 96.5 | 545 | 66 | 7 | 7 | 1211 | 0.71 |
| S9234 | 42.7 | 98.0 | 232 | 19 | 18 | 20 | 592 | 0.45 |
| S13207 | 60.4 | 99.0 | 887 | 36 | 21 | 27 | 1760 | 0.73 |
| S15850 | 52.5 | 100.0 | 1316 | 22 | 13 | 20 | 1751 | 0.53 |
| S35532 | 88.8 | 100.0 | 1562 | 124 | 33 | 32 | 652 | 1.0 |
| S38417 | 97.2 | 99.9 | 3687 | 13 | 5 | 24 | 7846 | 1.53 |
| S38584 | 81.7 | 100.0 | 2861 | 42 | 19 | 51 | 3209 | 0.83 |

FC-FAULT COVERAGE, FE-FAULT EFFICIENCY, CPU(S)-CPU SECONDS ON SUN ULTRASPARC, MAX P-MAX PARTITION SIZE, MAX D- MAX SEQUENTIAL DEPTH, MAX T-MAX TEST SEQUENCE LENGTH, VEC- NUMBER OF VECTORS, TAT-TEST APPLICATION TIME (NORMALIZED TO SD1 CASE)

FIG. 17

PERIPHERAL PARTITIONING AND TREE DECOMPOSITION FOR PARTIAL SCAN

I. BACKGROUND OF THE INVENTION

IA. Field of the Invention

The invention relates to scan techniques for sequential circuits. In particular, this invention relates to new partial scan techniques using peripheral partitioning and tree decomposition. The invention is embodied in a system to perform partial scan using peripheral partitioning and tree decomposition, in a method for partial scan using peripheral partitioning, in a method for partial scan using tree decomposition, and in a computer program product for enabling a computer to operate according to the method.

IB. Related Work

Complexity of testing sequential circuits is well known in the prior art. Two fundamentally different approaches have been pursued in the prior art to reduce the complexity of testing sequential circuits: (1) a synthesis approach, where practitioners synthesize circuits that are easy to test, and/or (2) a design for testability approach, where post-synthesis modification techniques are employed to facilitate easy testing of the circuit.

The synthesis approach requires prohibitive computational resources. Also, when a hierarchical design methodology is used, integrating testability requirements involving different blocks or modules is difficult.

Design for testability techniques such as scan have been used widely for achieving high test coverage for sequential circuits. In scan techniques, memory elements (including flip-flops) in a circuit are chained into a shift register. A full scan involves the chaining of all the shift registers in the circuit to be tested. Scan provides for direct controllability and observability of all memory elements during the test mode. However, area and performance penalties of full scan design are unacceptable for many sequential circuit designs.

Partial scan techniques involve selecting only a subset of memory elements. This reduces area and performance penalties involved in a full scan.

Several approaches for selecting memory elements for partial scan have been suggested in the prior art. Testability analysis based approach is one of the approaches that is known in the prior art. See E. Trischler, "Incomplete Scan Path with an Automatic Test Generation Methodology," in *Proceedings of the international Test Conference*, pp. 153–162, 1980; M. Abramovici, J. J. Kulikowski, and R. K. Roy, "The Best Flip-Flops to Scan," in *Proceedings of the International Test Conference*, pp. 166–173, 1991; K. S. Kim and C. R. Kime, "Partial Scan by Use of Empirical Testability," in *Proceedings of the International Conference on Computer-Aided Design*, pp. 314–317, November 1990; P. S. Parikh and M. Abramovici, "A Cost Based Approach to Partial Scan," in *Proceedings of the 30th ACM/IEEE Design Automation Conference*, pp. 255–259, June 1993 and D. Xiang and J. H. Patel, "A Global Algorithm for the Partial Scan Design Problem using Circuit State Information," in *Proceedings of the International Test Conference*, pp. 548–557, October 1996.

Another method suggested in the prior art is a test generation based approach. See V. D. Agrawal, K. T. Cheng, D. D. Johnson, and T. Lin, "Designing Circuits with Partial Scan," *IEEE Design and Test of Computers*, vol. 5, pp. 8–15, April 1988; H.-K. T. Ma, S. Devadas, A. R. Newton, and A. Sangiovanni-Vincentelli, "An Incomplete Scan Design Approach to Test Generation for Sequential Machines," in *Proceedings of the International Test Conference*, pp. 730–734, 1988; V. Chickermane and J. H. Patel, "A Fault Oriented Partial Scan Design Approach," in *Proceedings of the International Conference on Computer-Aided Design*, pp. 400–403, November 1991; I. Park, D. S. Ha, and G. Sim, "A New Method for Partial Scan Design based on Propagation and Justification Requirements of Faults," in *Proceedings of the International Test Conference*, pp. 413–422, October 1995; and V. Boppana and W. K. Fuchs, "Partial Scan Design based on State Transition Modeling," in *Proceedings of the International Test Conference*, pp. 538–547, October 1996.

Functional or state machine analysis based approaches have also been used in the prior art. See V. Boppana and W. K. Fuchs, "Partial Scan Design based on State Transition Modeling," in *Proceedings of the International Test Conference*, pp. 538–547, October 1996; C.-C. Lin, M. T.-C. Lee, M. Marek-Sadowska, and K.-C. Chen, "Cost Free Scan: A Low Overhead Scan Path Design Methodology," in *Proc. of the International Conference on Computer-Aided Design*, November 1995; C. C. Lin, M. Marek-Sadowska, K. T. Cheng, and M. T. C. Lee, "Test Point Insertion: Scan Paths through Combinational Logic," in *Proceedings of the 32nd ACM/IEEE Design Automation Conference*, pp. 268–273, June 1995; D. Chang, M. T. C. Lee, M. Marek-Sadowska, T. Aikyo, and K. T. Cheng, "A Test Synthesis Approach to Reducing BALLAST DFT Overhead," in *Proceedings of the 34th ACM/IEEE Design Automation Conference*, pp. 466–471, June 1997.

Several practitioners have used a structural analysis based approach. See R. Gupta, R. Gupta, and M. A. Breuer, "The BALLAST Methodology for Structured Partial Scan Design," *IEEE Transactions on Computers*, vol. C-39, pp. 538–544, April 1990; K. T. Cheng and V. D. Agrawal, "A Partial Scan Method for Sequential Circuits with Feedback," *IEEE Transactions on Computers*, vol. 39, pp. 544–548, April 1990; D. Lee and S. Reddy, "On Determining Scan Flip-Flops in Partial-Scan Designs," in *Proceedings of the International Conference on Computer-Aided Design*, pp. 322–325, November 1990; A. Kunzmann and H. J. Wunderlich, "An Analytical Approach to the Partial Scan Problem," *Journal of Electronic Testing: Theory and Applications*, vol. 1, pp. 163–174, 1990; S. Bhawmik, C. J. Lin, K. T. Cheng, and V. D. Agrawal, "Pascant: A Partial Scan and Test Generation System," in *Custom Integrated Circuits Conference*, pp. 17.3.1–17.3.4, 1991; S. E. Tai and D. Bhattacharya, "A Three Stage Partial Scan Design Method using the Sequential Circuit Flow Graph," in *Proceedings of the 7th International Conference on VLSI Design*, pp. 101–106, January 1994; S. T. Chakradhar, A. Balakrishnan, and V. D. Agrawal, "An Exact Algorithm for Selecting Partial Scan Flip-Flops," in *Proc. of the 31st ACM/IEEE DesignAutomation Conf.*, pp. 81–86, June 1994; A. Balakrishnan and S. T. Chakradhar, "Sequential Circuits with Combinational Test Generation Complexity," in *9th International Conference on VLSI Design*, January 1996; and T. Ono, "Selecting Partial Scan Flip-flops for Circuit Partitioning," in *Proceedings of the International Conference on Computer-Aided Design*, pp. 646–650, November 1994.

The testability analysis based methods use cost metrics during scan selection. The ability of testability based approaches to tightly correlate with sequential test generation effort required for large designs is not clearly established. Further, one often has to rely on the test generator to refine the measures and/or to gain confidence on the scan selection based on these testability measures. Some of the more sophisticated testability measures require large computational resources.

Test generation based approaches select scan memory elements based on identification of hard-to-detect faults. This approach is tightly coupled with the test generation tool and does not offer the designer any flexibility to determine scan flip-flops a priori. Further, scan selection strongly depends on the order of faults chosen by the test generation.

Often, one may have to perform multiple test generation runs to obtain good scan selection. This approach further constraints the already computationally intensive test generation process. Recent work by V. Boppana and W. K. Fuchs incorporates state machine analysis within the test generation based approach to select partial scan flip-flops. The applicability of such approaches to large designs have not been established.

Another recent functional approach showed that functional or cost-free scan paths can be established for any scan selection. See C.-C. Lin et al., "Cost Free Scan: A Low Overhead Scan Path Design Methodology," in *Proc. of the International Conference on Computer-Aided Design,* November 1995. This method involves computation of ordered binary decision diagrams (OBDD's). Therefore, it may prove to be computationally expensive for large designs.

Other recent efforts have shown the use of test points to establish functional scan paths. See C. C. Lin, M. Marek-Sadowska, K. T. Cheng, and M. T. C. Lee, "Test Point Insertion: Scan Paths through Combinational Logic," in *Proceedings of the 32nd ACM/IEEE Design Automation Conference,* pp. 268–273, June 1995 and D. Chang, M. T. C. Lee, M. Marek-Sadowska, T. Aikyo, and K. T. Cheng, "A Test Synthesis Approach to Reducing BALLAST DFT Overhead," in *Proceedings of the 34th ACM/IEEE Design Automation Conference,* pp. 466–471, June 1997. These techniques can be used to complement any scan selection approach, including the present invention, to provide an effective way to implement/synthesize scan chains.

Structural partial scan methods analyze the structure of the flip-flop dependency graph and base their scan selection on structural properties of this graph. Most of the structural methods have centered around breaking feedback loops, a technique first introduced by Cheng et al. See Cheng and V. D. Agrawal, "A Partial Scan Method for Sequential Circuits with Feedback," *IEEE Transactions on Computers,* vol. 39, pp. 544–548, April 1990. This approach called self-loop acyclic all feedback loops except self-loops are broken. A self-loop here refers to a situation where the output of a flip-flop, after passing through combinational logic, feeds back into the same flip-flop. This approach results in low area overhead, however, it is not effective for test generation.

At the other extreme one can break all feedback loops including self-loops. This approach called pipeline, results in a scan circuit with almost combinational ATPG complexity. See H. B. Min and W. A. Rogers, "A Test Methodology for Finite State Machines using Partial Scan Design," *Journal of Electronic Testing: Theory and Applications,* vol. 3, pp. 127–137, May 1992. However, this approach can result in high area overhead because most of the flip-flops in a typical design have self-loops. An extension of the pipeline approach advocates limiting the sequential depth of the design during the test mode.

Several partial scan techniques have been proposed recently but they either lack the ability to provide adequate test coverage for modest to large designs or they do not yield significant reduction in area/performance penalties as compared to full scan design. For example, consider the two analogous approaches for partial scan: one selecting flip-flops to break all feedback cycles except self-loops (self-loop acyclic) and the other selecting flip-flops to break all feedback cycles including self-loops (pipeline). FIG. 13 depicts a table showing area overhead and test generation results for the larger benchmark circuits. The data shows that self-loop acyclic technique entails low area overhead but the scanned circuits are hard to test. Pipeline method produces circuits that are easy to test but this method entails high area overhead.

II. SUMMARY OF THE INVENTION

It is an objective of this invention to solve the problems associated with partial scan techniques.

In the current invention a novel structural decomposition approach for selecting partial scan memory elements that can result in circuits with very high test coverage while entailing low area/performance penalties is disclosed. The distinguishing features of the approach used in the current invention are (a) it drastically reduces the test generation effort (b) it will scale well for large designs without compromising on test coverage and (c) it is easy to implement like fill-scan design or any structural approach.

Specifically an objective of this invention is to provide a method of performing partial scan of a sequential circuit using peripheral partitioning.

It is another objective of this invention to provide a method for performing partial scan of a sequential circuit using tree decomposition.

Yet another objective of this invention is to provide a method for partitioning a sequential circuit into peripheral partitions.

Yet another objective of this invention is to provide a method to solve the cycle cut-set problem, associated with peripheral partitioning.

Yet another objective of this invention is to provide a method for tree decomposition of an undirected graph, representing a sequential circuit, into trees.

Yet another objective of this invention is to provide a system that uses peripheral partitioning method and the tree decomposition method of the current invention to form a partial scanned circuit.

Yet another objective of this invention is to provide a program product that enables a computer to perform the peripheral partitioning method and the tree decomposition method of the current invention to form partial scanned circuit.

To achieve the objectives of the invention, it is provided a partial scan system for sequential circuits comprising an input unit, a peripheral partitioning unit, a tree decomposition unit, a circuit redesign unit and an output unit.

Another embodiment of the present invention is a system and method of partial scan for a sequential circuit using peripheral partitioning. This invention also includes a system and method of partial scan for a sequential circuit using tree decomposition.

Another embodiment of this invention is a system and method of peripheral partitioning a sequential circuit to form a plurality of partitions, wherein each of said plurality of partitions comprise a group of memory elements, each memory element in said group of memory element do not form a combination path with memory elements not belonging to said group of memory elements.

Another embodiment of this invention is a method of peripheral partitioning a sequential circuit comprising:

drawing an S-graph of the sequential circuit; remodeling the S-graph into a new undirected graph; eliminating cycles in the new undirected graph by selecting a minimal set of vertices.

Another embodiment of this invention is a method of selecting a minimal set of vertices to break all cycles comprising computing bi-connected components to form a plurality of bi-connected components; adding one vertex from each of said plurality of bi-connected components to a cycle cut-set; removing said one vertex from each of said plurality of biconnected components; and repeating the steps until there are no more bi-connected components.

Another embodiment of the current invention is a method of tree decomposition of an S-graph with a plurality of vertices, each of said plurality of vertices having an out-degree, a plurality of in-degree vertices and a cost, said method comprising: computing out-degree for each vertex; initializing said cost of said each vertex to zero using the formula: cost (v)=0, wherein v is said each vertex, wherein cost(v) is cost of said each vector v; updating cost of said each vertex using the formula: cost(v)=out-degree(v)−1, if out-degree(v) is greater than 1, wherein out-degree(v) is said out-degree of said each vertex v; updating cost of said each vertex using the formula: cost(v)=cost(v)+one, if out-degree (w)>1, wherein w is each said in-degree vertex of v, wherein out-degree(w) is said out-degree of w; repeating the previous step for each in-degree vertex of v; repeating cost calculations for each vertex in the graph; removing a vertex with the maximum cost and adding to said cut-set list; repeating the whole cost computation process until updated cost for each vertex not removed is less than or equal to 0; and returning said cut-set list.

Another embodiment of this invention is a computer program product comprising, computer readable instructions, and a computer readable medium bearing said computer readable instructions; said instructions being adaptable to enable a computer to operate according to the steps of: receiving a sequential circuit from the user; tree decompositioning the circuit for a partial scan; returning the partial scan circuit to the user.

Another embodiment of this invention is a computer program product comprising, computer readable instructions and a computer medium bearing said computer readable instructions; said instructions being adaptable to enable a computer to operate according to the steps of: receiving a sequential circuit from the user; peripheral partitioning the circuit to form a partial scanned circuit; checking if tree decompositioning can be performed on this partial scanned circuit; tree decompositioning the circuit if tree decompositioning can be performed on the circuit to form a refined partial scanned circuit; returning the refined partial scanned circuit to the user.

III. BRIEF DESCRIPTION OF THE DRAWINGS

The above advantages and objectives will become more apparent by describing in detail preferred embodiments thereof with reference to attached drawings.

Figure 5:
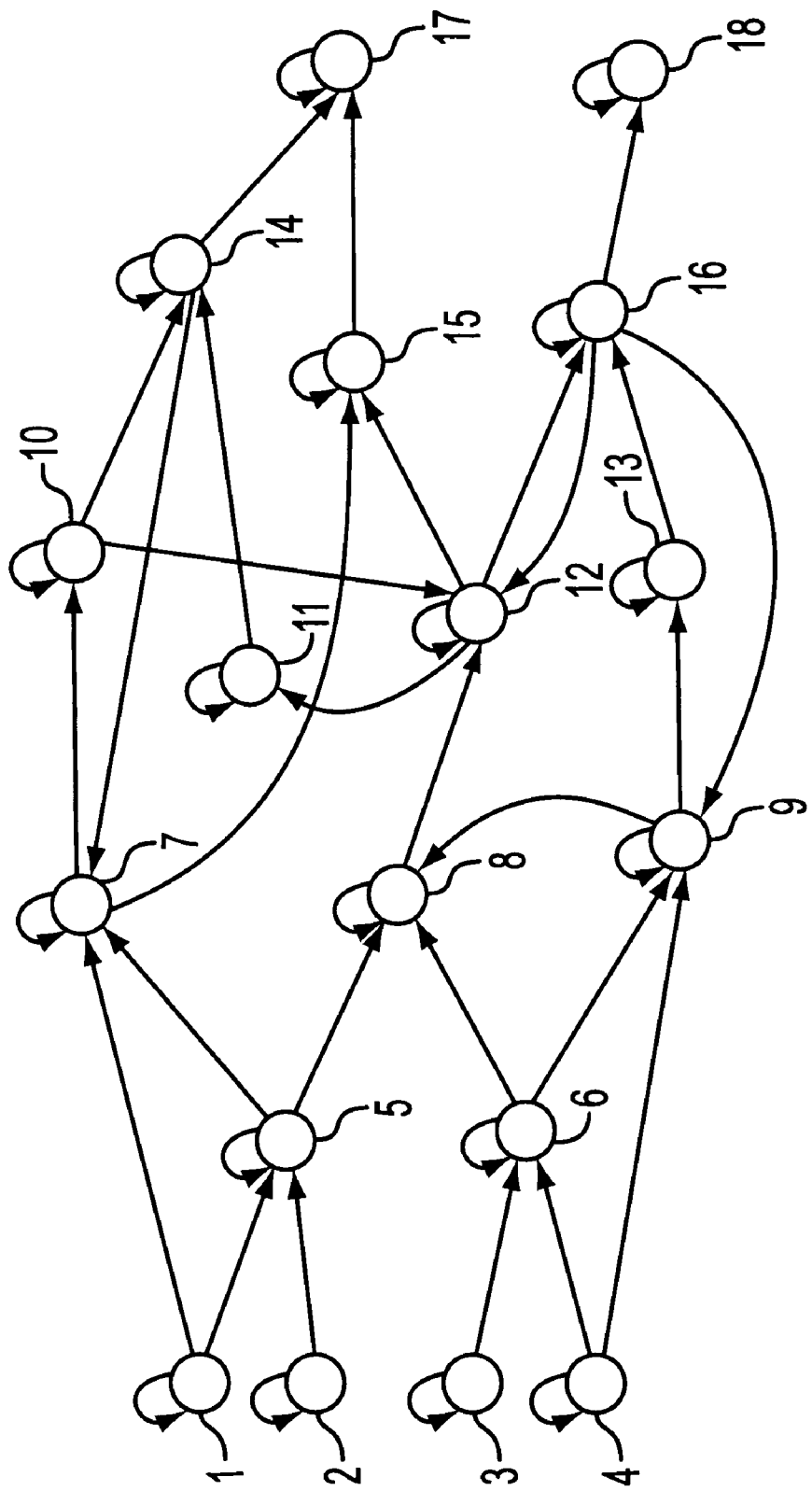

FIG. 5 provides an example of a S-graph.

Figure 6:
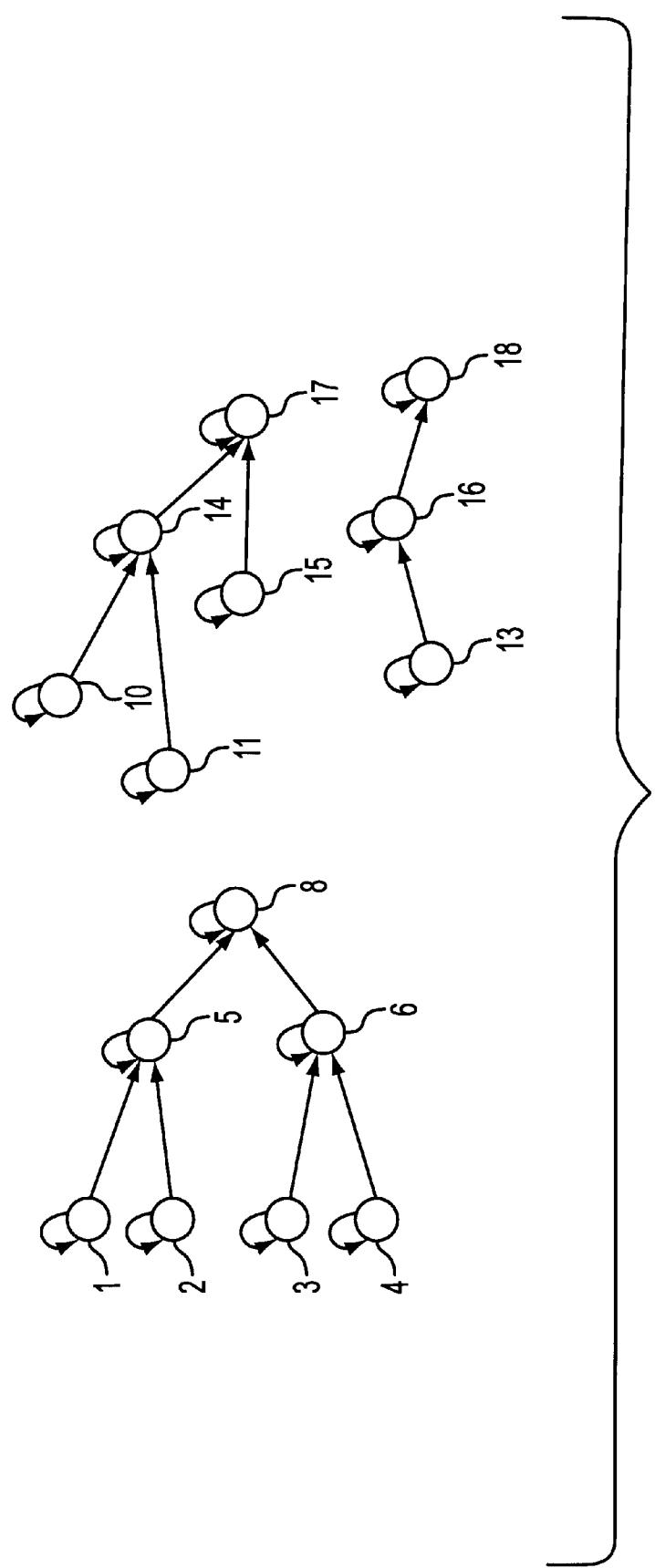

FIG. 6 depicts the peripheral partitions of the example S-graph provided in FIG. 5.

Figure 7:
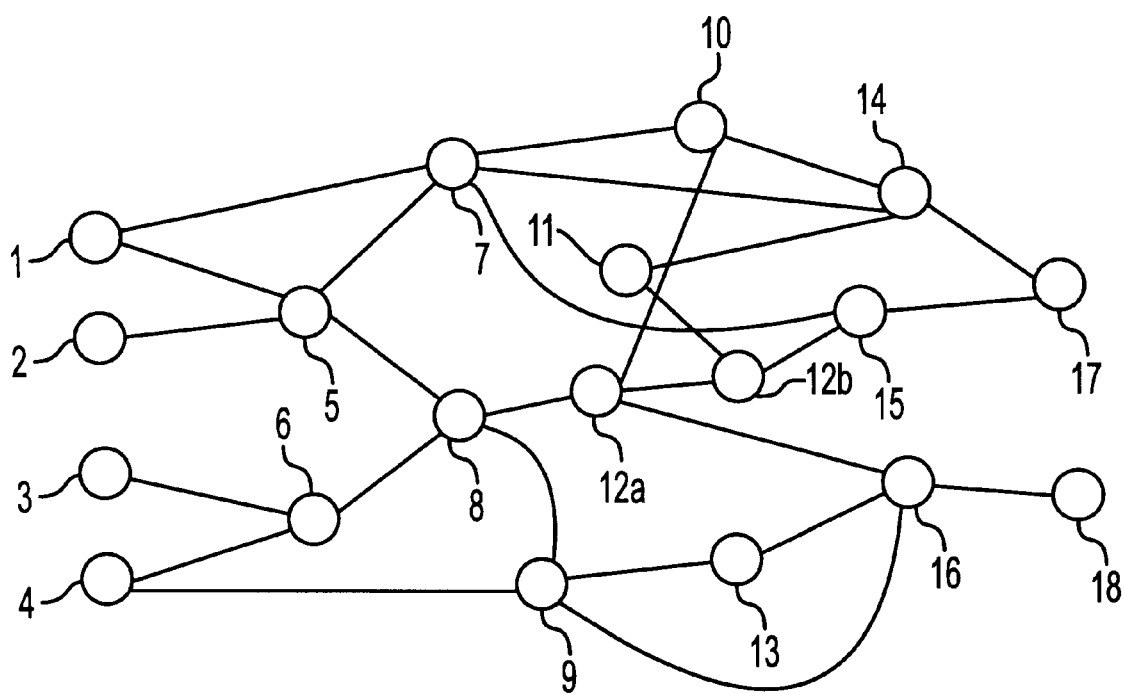

FIG. 7 depicts a remodelled S-graph of the sequential circuit provided in FIG. 5 in the form of a undirected graph.

Figure 8:
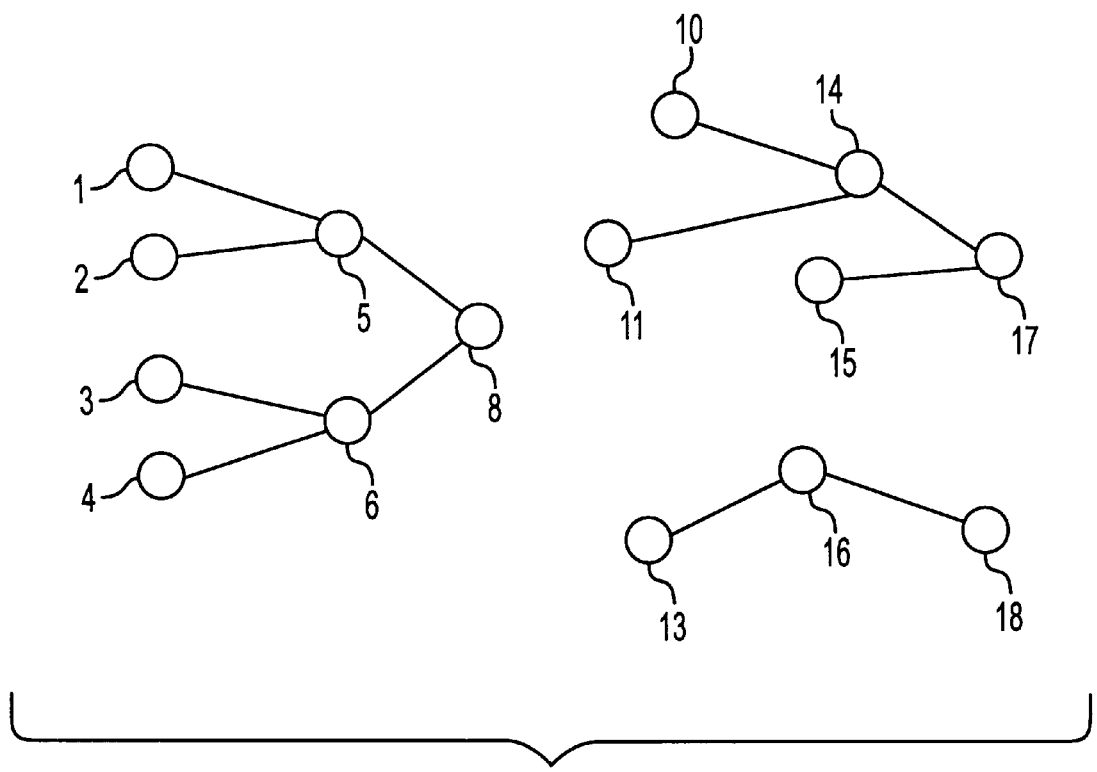

FIG. 8 shows the tree decomposition partitioning of the undirected S-graph.

Figure 9:
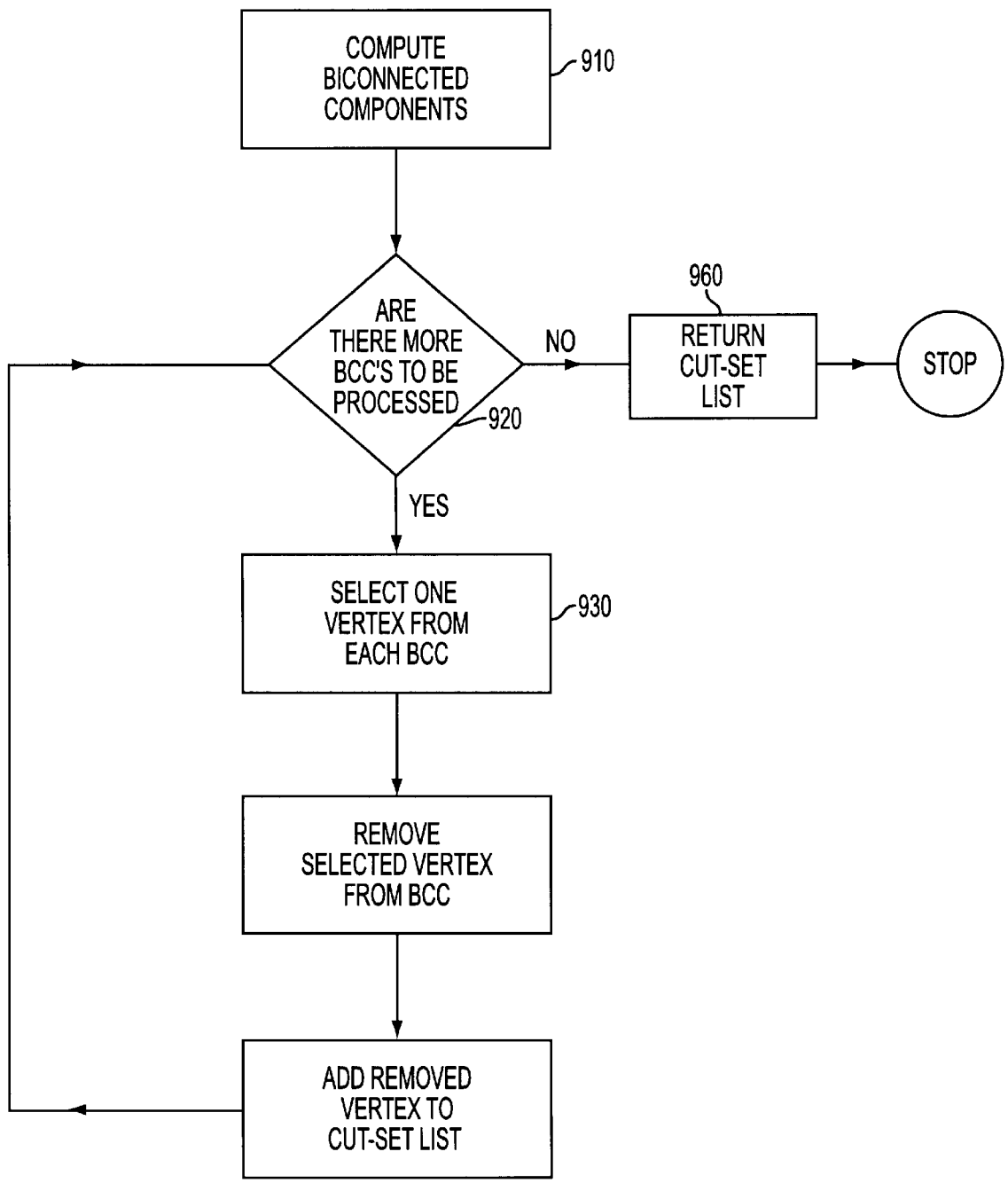

FIG. 9 is a flowchart showing the steps in performing the peripheral partitioning of a sequential circuit according to the present invention.

Figure 10:
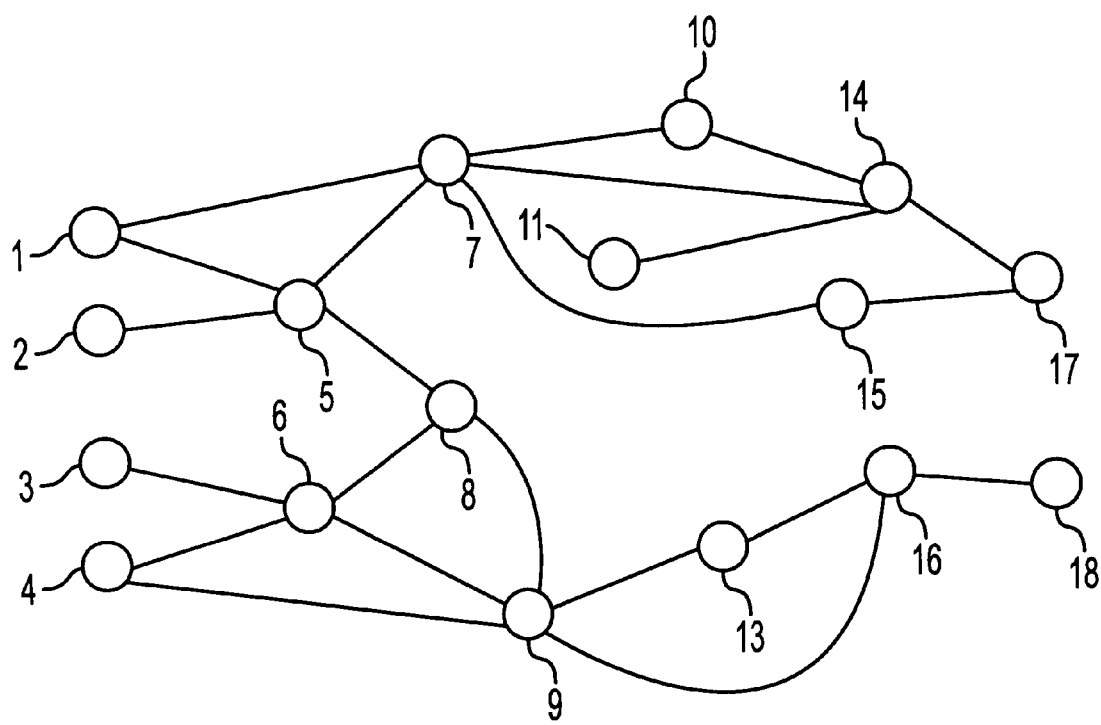

FIG. 10 shows a undirected S-graph after one iteration.

Figure 11:
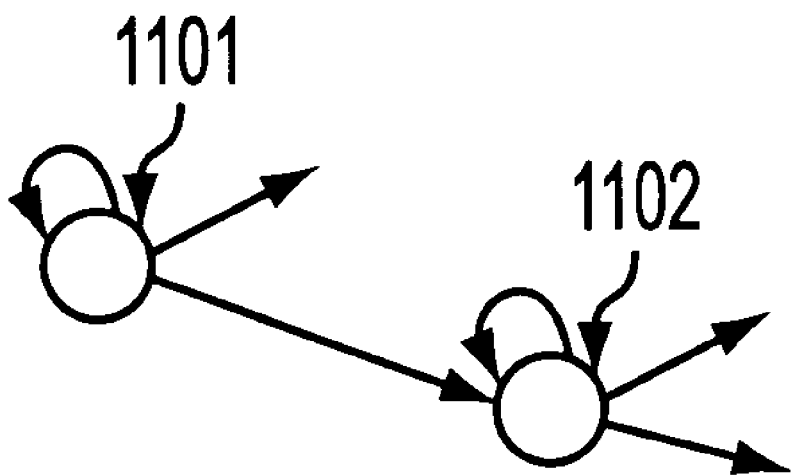

FIG. 11 shows a cost model for tree decomposition heuristic.

Figure 12A:
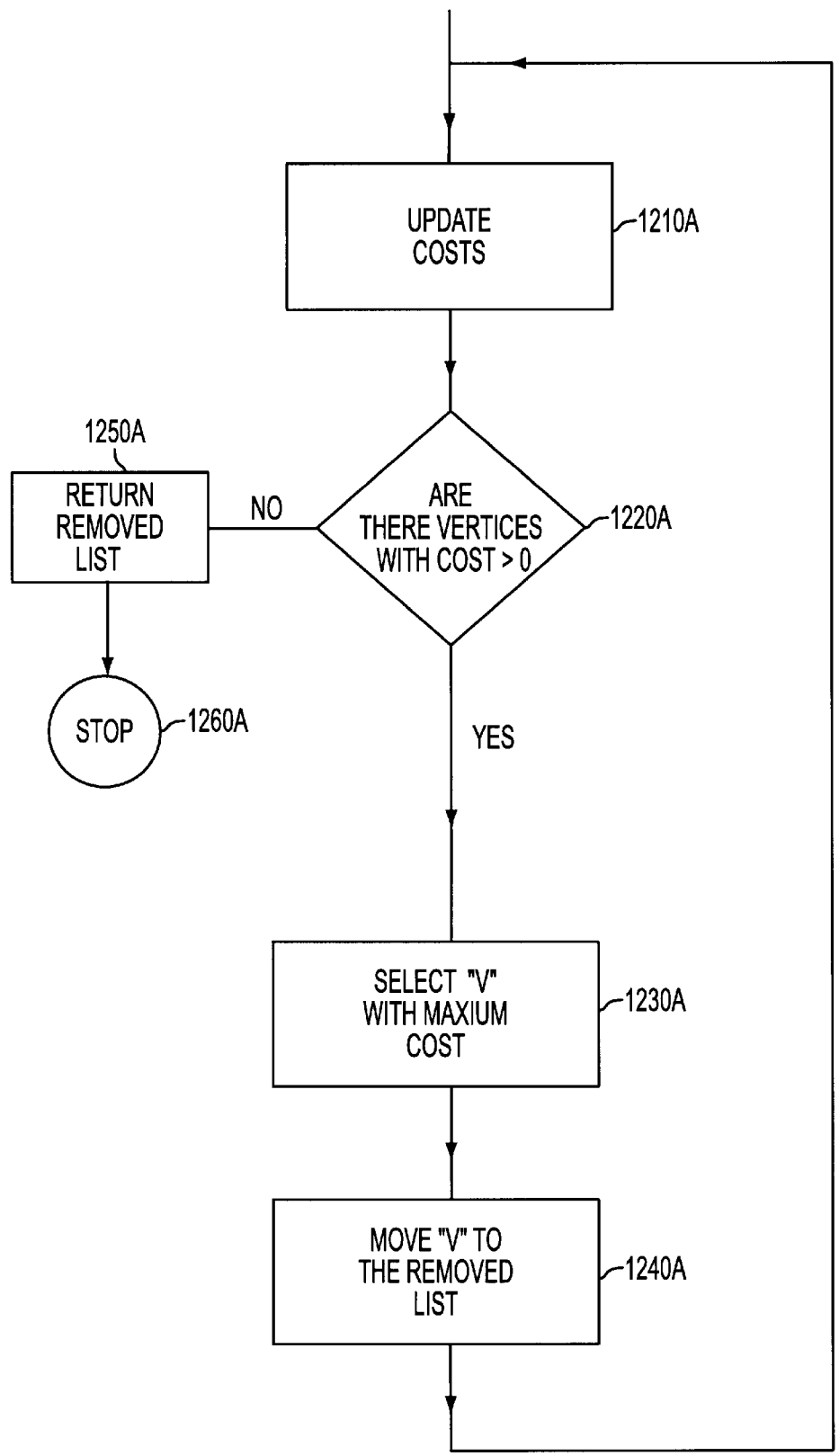

FIG. 12A is a flowchart showing the steps in performing tree decompositioning of a sequential circuit according to the present invention.

Figure 12B:
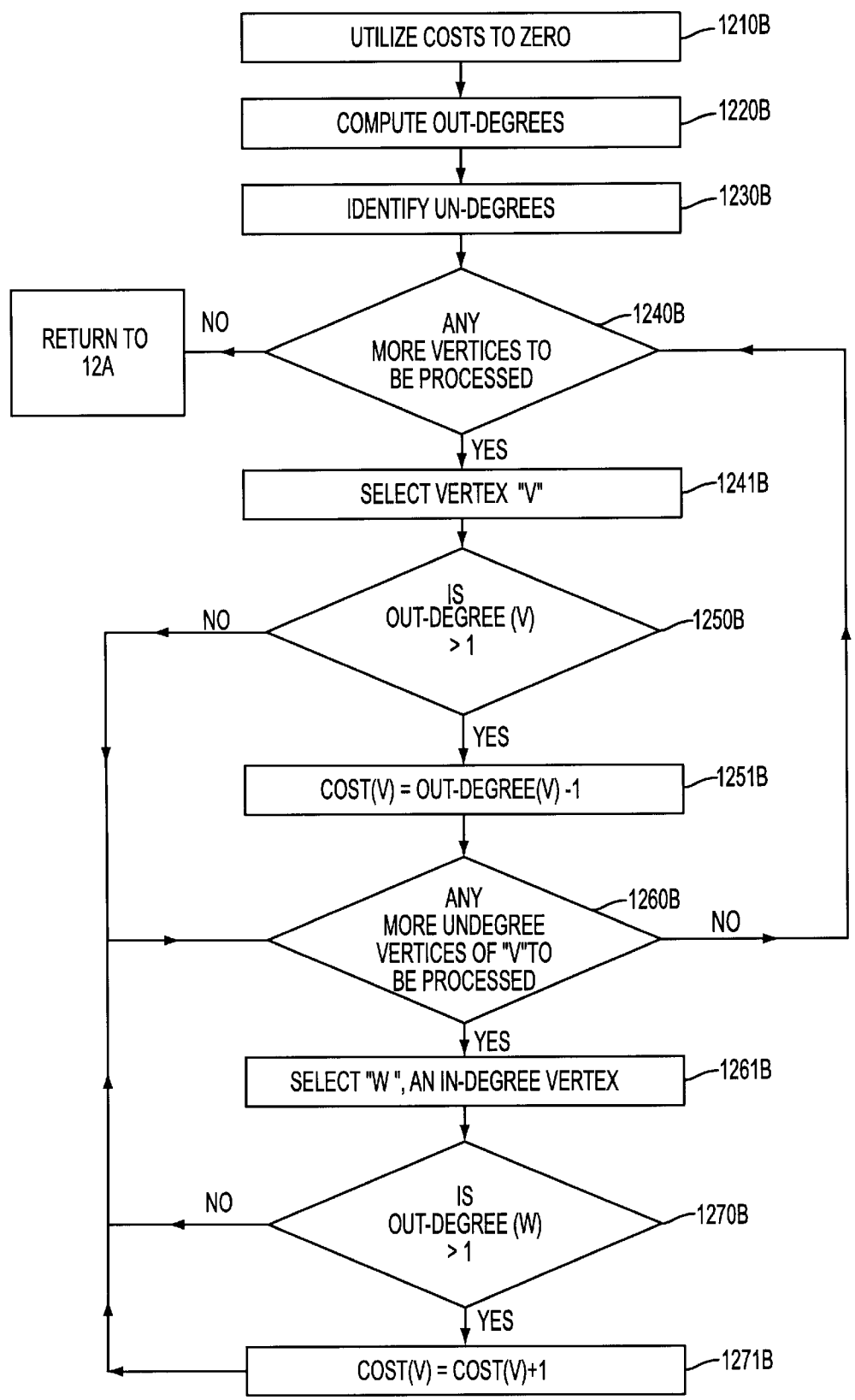

FIG. 12B is a flowchart showing the steps in updating cost for the tree decompositioning of a sequential circuit according to the present invention FIGS. 13–17 show tables illustrating the results of experiments conducted using the ISCAS 89 sequential benchmark circuits.

IV. DETAILED DESCRIPTION

The preferred embodiments are described using flop-flops. However, the scope of this invention is not limited to flip-flops. Any kind of memory element can be used.

To overcome the problems associated with the partial scan of a sequential circuit, a new partial scan technique that incurs significantly less overhead than the full-scan technique and yet produces highly testable circuits is provided. A key component of this invention is the selection of scan flip-flops so that the circuit satisfies two key properties in the test mode.

According to one aspect of this invention the circuit is partitioned into peripherally interacting finite state machines (peripheral partitions). Peripheral partitions do not have combinational paths between flip-flops belonging to different partitions.

Another aspect of this invention is that the flip-flop dependency graph (S-graph) of a sequential circuit is decomposed into peripheral partitions that have a tree structures. It is to be noted that both peripheral partitioning and tree decomposition should be used in combination for best results.

S-graph captures dependencies among flip-flops by including an arc from flip-flop $F_1$ to flip-flop $F_2$ if there is a combinational path from $F_1$ to $F_2$. This invention show that peripheral partitions with tree structure S-graphs inherently require low sequential test generation resources.

A further aspect of this invention is to provide an efficient algorithm for peripheral partitioning and tree decomposition. The scan flip-flop selection algorithm iteratively partitions the S-graph into several disjoint sub-graphs that have special structures. This invention examines sub-graphs that are trees.

Peripheral partitioning and tree decomposition do not require breaking of self-loops. This is advantageous since most of the flip-flops in industrial designs have self-loops.

Several partial scan techniques have been published but none of them have been able to uniformly achieve very high (near 100%) fault efficiency. For the first time, results with very high (near 100%) fault efficiency for all the large ISCAS 89 benchmark circuits using a partial scan methodology that allows self-loops have been observed using the present approach. Experimental results also show that the test generation time required to achieve this high (near 100%) fault efficiency is also very short.

The high fault efficiencies achieved by the present technique is comparable to that of pipeline circuits (all feedback cycles including self-loops are broken). However, the area overhead for the inventive techniques is significantly less than the prior art pipeline approach.

The self-loop acyclic technique; the other prior art approach, incurs very low scan area overhead but it also produces circuits with very poor testability.

Results show that tree decomposition inherently leads to low sequential test generation complexity. Peripheral partitioning and tree decomposition algorithm according to this invention are easily scalable to large circuits.

IVA. Peripheral Partitions

Figure 1:
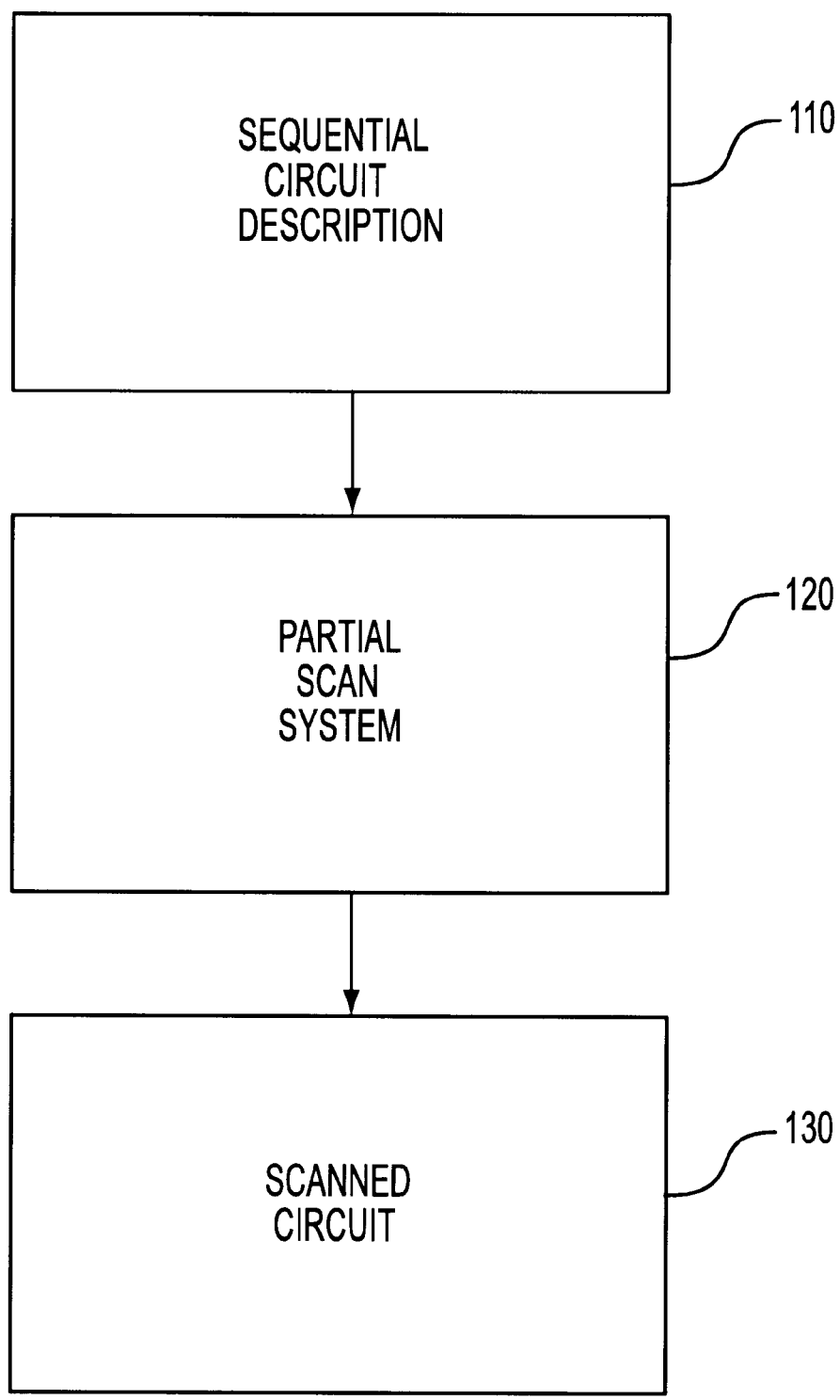
FIG. 1 is a partial scan system according to the present invention.

FIG. 1 depicts a partial scan system according to the present invention. In block 110 a sequential circuit description is input to the system. In block 120 the sequential circuit is partial scanned according to the present invention. In block 130 the partial scanned circuit is returned to the user.

Figure 2:
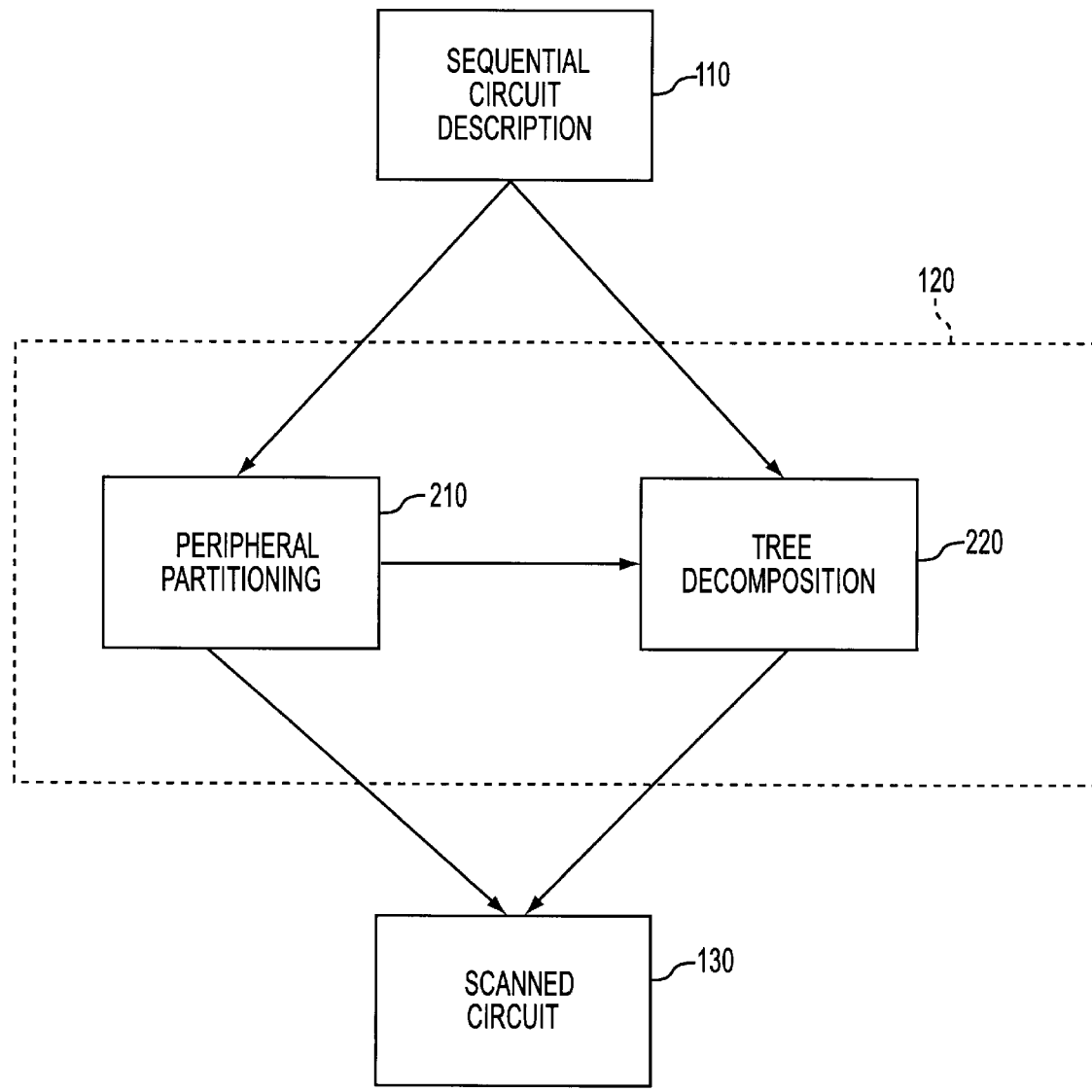
FIG. 2 is a partial scan system that performs peripheral partitioning and tree decompositioning according to the present invention.

FIG. 2 depicts a more detailed description of the present invention. In block 210 the sequential circuit description is peripherally partitioned according to the present invention. In block 220 a tree composition is performed on the resulting sequential circuit.

The structural dependencies among flip-flops can be represented by a directed graph, called the S-graph. See D. Lee and S. Reddy, "On Determining Scan Flip-Flops in Partial-Scan Designs," in *Proceedings of the International Conference on Computer-Aided Design,* pp. 322–325, November 1990. S-graph has a vertex for every flip-flop in the circuit. There exists an arc from vertex $v_i$ to vertex $v_j$ if there is a combinational path from flip-flop $v_i$ to flip-flop $v_j$. Also, there is an arc from vertex $v_i$ to itself (self-loop) if there is a combinational path from flip-flop $v_i$ to itself.

Figure 3:
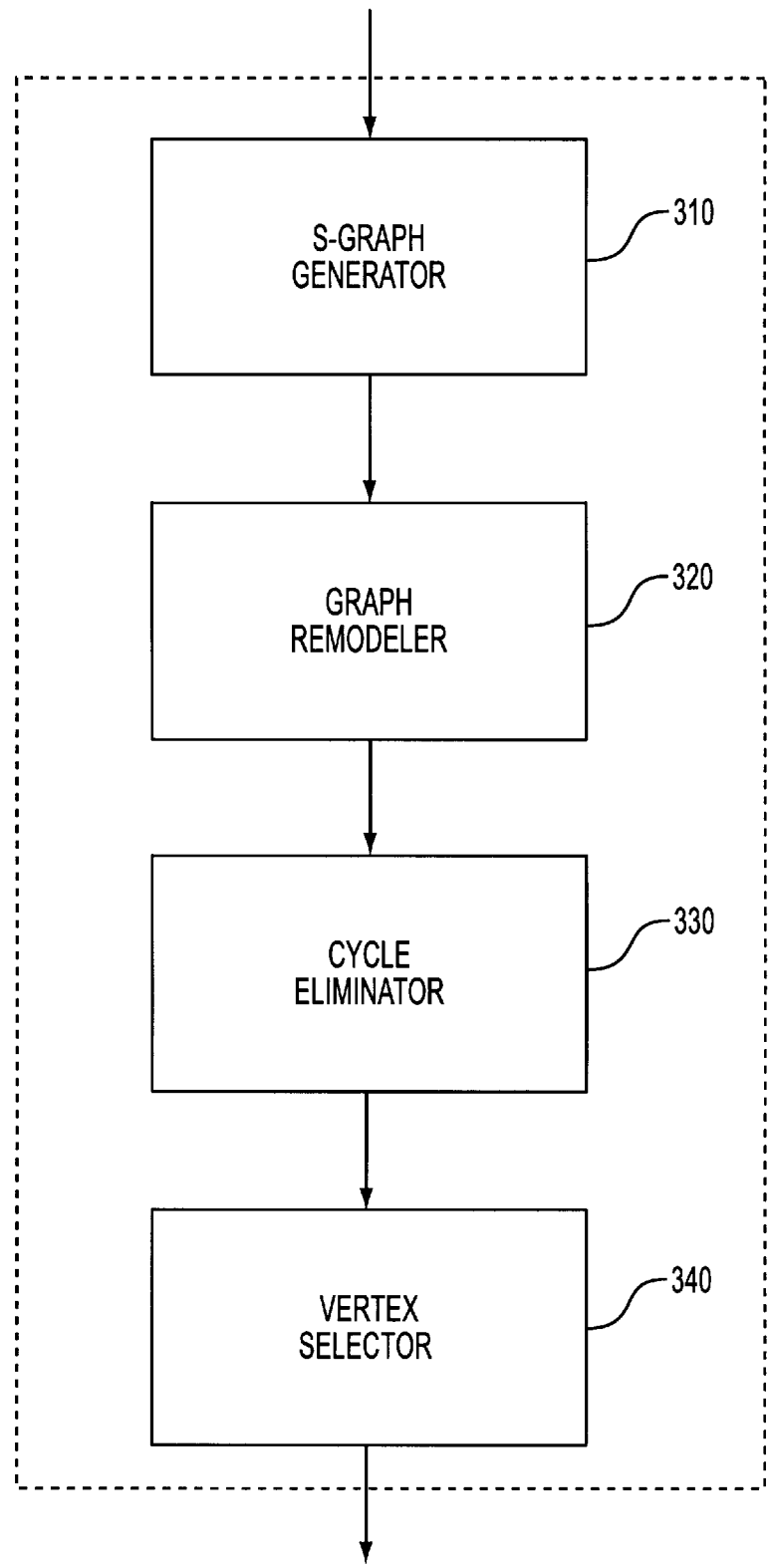
FIG. 3 is a partial scan system that solves the cycle cut set problem according to the present invention.

In FIG. 3 a more detailed representation of the peripheral partition using S-graphs is presented. In block 310 an S-graph for a sequential circuit is generated. The S-graph is then input to block 320 where the graph is remodeled to produce a new undirected graph. In block 330 vertices are selected and removed so that cycles in this S-graph are eliminated. In block 340 the removed vertices are included in a scan chain partial scanned sequential circuit.

Figure 4:
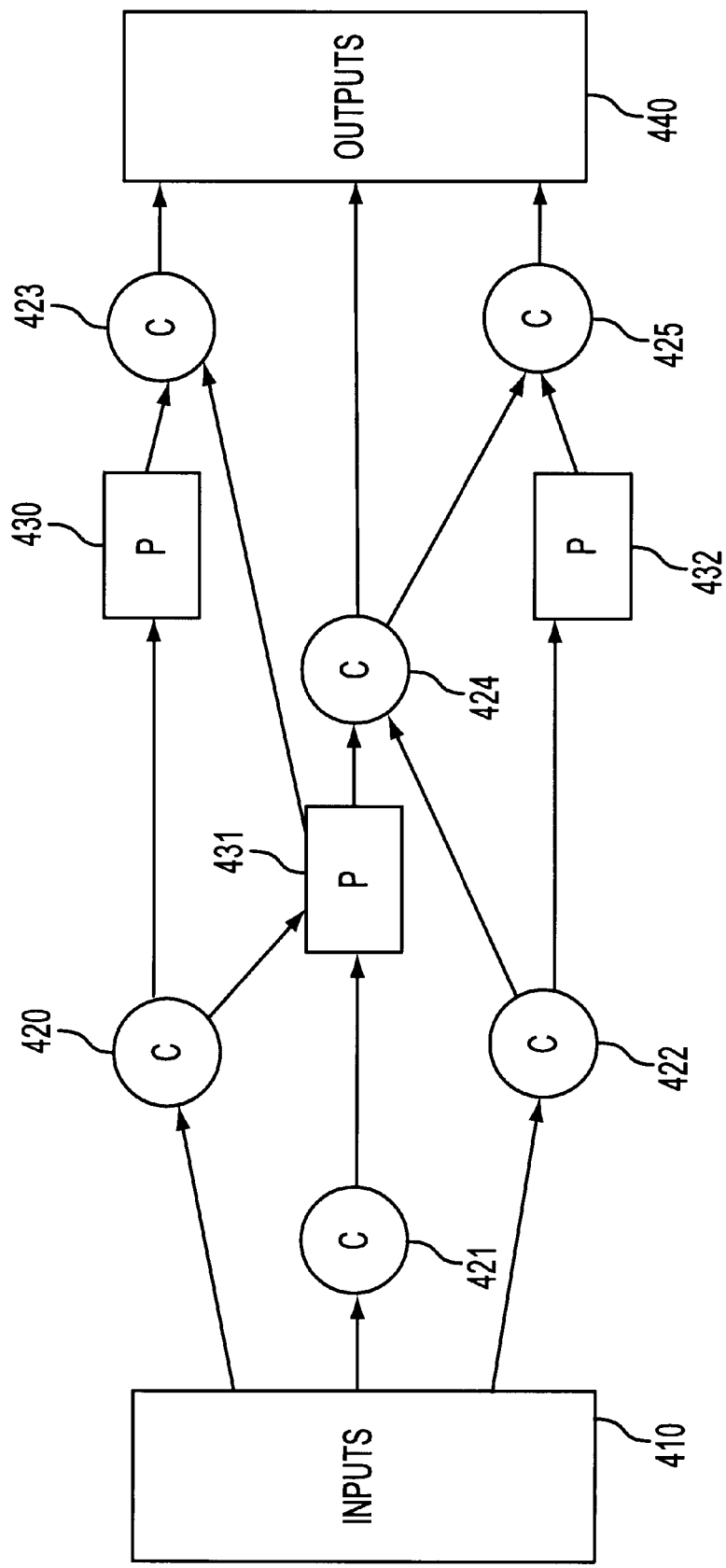
FIG. 4 represents a sequential circuit in the form of peripherally interacting partitions.

Consider a sequential circuit shown in FIG. 4. This circuit has several primary inputs and outputs. Circles labeled as C (blocks 420–425) are combinational logic blocks that are shared among several finite state machines (partitions) represented by rectangular boxes that are labeled as P (blocks 430–432).

There are three characteristics of the sequential circuit of FIG. 4 that are of interest. First, component finite state machines can be of arbitrary complexity but there are no combinational paths between flip-flops of different partitions. In particular, component machines can have feedback paths involving an arbitrary number of flip-flops. Second, component state machines share only primary inputs, primary outputs and combinational logic blocks. Therefore, outputs of a partition cannot drive the inputs of another partition. Third, the next state of a partition is determined only by the present state of flip-flops in the partition. In particular, the next state does not depend on the present state of flip-flops in other partitions.

Peripheral partitions can be identified by constructing the S-graph. If the vertices of the S-graph can be partitioned such that arcs exist only between vertices in the same partition, then the S-graph naturally has peripheral partitions. If the S-graph does not have peripheral partitions, then one can identify scan flip-flops to induce peripheral partitions in the test mode.

For example, consider the S-graph shown in FIG. 5. This graph corresponds to a circuit with 18 flip-flops. Note that every flip-flop has a self-loop and the circuit has feedback cycles that include more than one flip-flop. This S-graph has no peripheral partitions. This is because it is impossible to partition the vertices into disjoint sets so that arcs exist only between vertices of the same partition. However, if flip-flops 7, 9 and 12 are selected for partial scan, then the S-graph in the test mode is as shown in FIG. 6. This graph has three peripheral partitions: {1, 2, 3, 4, 5, 6, 8}, {10, 11, 14, 15, 17}, and {13, 16,18}.

Initialization of flip-flops is an important first step in sequential test generators. See Miczo, *Digital Logic Testing and Simulation.* Harper and Row, New York, 1986; W. T. Cheng and T. J. Chakraborty, "Gentest: An Automatic Test Generation System for Sequential Circuits," *Computer,* vol. 22, pp. 43–49, April 1989; T. M. Niermann and J. H. Patel, "HITEC: A Test Generation Package for Sequential Circuits," in *Proc. European Design Automation Conference,* pp. 214–218, March 1991; H.-K. T. Ma, S. Devadas, A. R. Newton, and A. Sangiovanni-Vincentelli, "A Synthesis and Optimization Procedure for Fully and Easily Testable Sequential Machines," *IEEE Transactions on Computer Aided Design,* vol. 8, pp. 1100–1107, October 1989; A. Ghosh, S. Devadas, and A. R. Newton, *Sequential Logic Testing and Verification.* Kluwer Academic Publishers, Boston, 1992; and X. Chen and M. L. Bushnell, "Dynamic State and Objective Learning for Sequential Circuit Automatic Test Generation Using Decomposition Equivalence," in *Proceedings of the 24th IEEE International Symposium on Fault Tolerant Computing,* pp. 446–455, June 1994.

Peripheral partitions are particularly attractive since initialization of flip-flops in a partition can be performed independent of flip-flops in other partitions.

IVB. Tree Decomposition

Consider the peripheral partition {13, 16, 18} shown in FIG. 6. If self-loop arcs are ignored, then the partition has an S-graph that is a tree with a single sink vertex 18. Every vertex has at most one outgoing arc, ignoring the self-loop arc. S-graphs of the remaining two partitions are also trees with exactly one sink vertex. Partitioning of an S-graph into sub-graphs that are trees with exactly one sink vertex is referenced to as a tree decomposition.

A tree decomposition has two desirable properties. First, there is no sequential re-convergence if we ignore the self-loops. For example, consider the S-graph of FIG. 5. The sub-graph consisting of vertices 6, 8 and 9 forms a sequential re-convergence for flip-flop 6. However, after selecting three flip-flops for scan, this S-graph is partitioned into a tree decomposition. Absence of sequential re-convergence eliminates signal correlations across multiple time frames. This could potentially lead to a reduction in sequential test generation effort. Second, initialization of flip-flops in a tree decomposition can be performed in a levelized order. Consider the peripheral partition {1, 2, 3, 4, 5, 6, 7} shown in FIG. 6. Since the sub-graph is a tree, it is possible to assign level numbers to the vertices.

Roots are assigned a level of 0. Every other vertex is assigned a level that is one more than the maximum level of any of its immediate predecessors. Flip-flop initialization can be performed level by level by first initializing flip-flops at leaf level and proceeding one level after another to the root.

IVC. Peripheral Partitioning Algorithm

Scan flip-flops are selected to partition the S-graph into peripheral partitions with tree structures using a two-part procedure. First, the directed S-graph of FIG. 5 is remodelled into an undirected graph as shown in FIG. 4 (self-loop arcs are not shown). Note that the two-cycle with vertices 12 and 16 will reduce to a single edge since every arc is replaced by an edge.

To account for this the vertex 12 is split into 12a and 12b. All the incoming arcs of vertex 12 in FIG. 2 are now shown as edges incident to 12a and all the outgoing arcs of vertex 12 are shown as edges incident to 12b. An edge is also added between 12a and 12b. The two-cycle {12, 16} has been expanded to the cycle {12a, 16, 12b}. A minimum set of vertices to break all cycles in the undirected model is selected.

This ensures that not only all feedback cycles with two or more flip-flops are broken, but all sequential re-convergences are also broken. For the example undirected S-graph, if vertices 7, 9 and 12 are selected then the S-graph is partitioned into peripheral partitions that satisfy the tree decomposition. The undirected S-graph obtained after scan selection is shown in FIG. 8. However, partitions obtained after the first phase may not always satisfy the tree decomposition requirement that every partition have exactly one sink vertex. It is possible that a partition may have more than one sink vertex. For such cases tree decompositioning, another aspect of this invention, is performed.

IVD. Cycle Cut-Set Algorithm

The problem of selecting a set of vertices in an undirected graph whose removal breaks all (undirected) cycles is referred to as the cycle cut set problem. The smallest such set called the minimum cycle cut set is to be found. This problem belongs to the class of NP-hard problems. An efficient heuristic to find a cycle cut set in the undirected model of the S-graph is another aspect of this invention. The following procedure computes a cycle cut set.
Procedure Cycle Cut Set(S)
do {
compute biconnected components (BCC's);
pick one vertex from each bcc and add to ccs_list;
remove(v) for all vertices 'v' picked from the BCC's;
} while (S has biconnected components)
return(ccs_list);

A biconnected component (BCC) of an undirected graph is a maximal set of edges such any two edges in the set lie on a common simple cycle. See T. H. Cormen, C. E. Leiserson, and R. L. Rivest. In other words for any two vertices in the biconnected component there exist two distinct vertex disjoint paths. It is to be noted that cycles and biconnected components are closely related. If a graph does not have cycles it will not have any biconnected components and vice-versa.

Consider again the example graph shown in FIG. 4. The set of vertices {6,7,8,9,10,11,12a,12b, 13,14,15,16,17,18} form a biconnected component. This is the only biconnected component for this graph. Vertex 12a is selected and all edges incident to it are removed (and hence, all edges connected to the sibling 12b as well). The resulting graph is as shown in FIG. 10. This graph has 4 biconnected components—{7,10,14}, {1,2,7}, {4,6,8,9} and {9,13,16}.

Note that a vertex can belong to more than one biconnected component such as vertex 9. If vertices 7 and 9 are selected and the associated edges removed, then the resulting decomposed graph is as shown in FIG. 8.

In each iteration, at least one vertex from every BCC is selected. The vertex whose biconnected degree (the incident edges that belong to biconnected components) is the highest for that component is selected. Note that the edges incident to a vertex can belong to different biconnected components (and hence the vertex will belong to each of these bcc's) and the biconnected degree is sum of these edges. After a few passes the S-graph will not have any biconnected components implying that all the cycles have been broken. Flip-flops corresponding to selected vertices (ccs_list) are the scan flip-flops. If the scan flip-flops are removed from the S-graph, then the graph has no sequential reconvergence except through self-loops. However, vertices can have out-degree>1 and these sub-graphs may not satisfy a tree decomposition yet.

FIG. 9 depicts a flowchart of the cycle cut-set problem according to the present invention. The sequential circuit graph is input to block 910. Block 910 computes the biconnected components of the graph. In 920 the algorithm enters a loop. In block 920 a decision is made whether there are any more BCC's to be processed. If there are no more BCC's to be processed the cut-set said list is returned in 960. If there are more BCC's to be processed then the algorithm enters block 930. In block 930 one vertex is selected from each BCC. In block 940 the selected vertex is removed from the BCC. In block 950 the removed vertex is added to the cut-set list and the algorithm returns to block 920. The cut-set list is returned to the user in block 960.

IVE. Tree Decomposition

An important aspect of this invention is a scan selection procedure that identifies vertices that have to be removed to satisfy the tree decomposition. Sub-graphs in a tree decomposition are trees with exactly one sink vertex.

Consider the graph structure shown in FIG. 11. Removing vertex 2 reduces the out-degree of vertex 1 to one whereas removing vertex 1 does not reduce the out-degree of vertex 2. A heuristic algorithm to select a set of vertices whose removal will result in the desired (tree like) sub-graph structure is developed. The following procedure finds the out-degree cut set.
Procedure Out-degree Cut Set(S)
initialize cost(v)=0;
for each vertex 'v' {
if (out-degree(v)>1);
cost(v)=out-degree(v)−1;
for each in-degree vertex 'w' {
if (out-degree(w)>1);
cost(v)=cost(v)+1;
}
}
while (costs>0) {
pick 'v' with max cost and remove(v);
update costs;
}
return(vertices picked);
Flip-flops corresponding to vertices selected for the out-degree cut set are also included in the scan selection. The S-graph, after removal of scan flip-flops, now consists of only peripheral sub-graph partitions that also satisfy the tree decomposition requirements.

Flowchart in FIG. 12A represents a flowchart for tree decomposition. In block 1210A costs associated with all the vertices are updated using the algorithm represented by the flowchart shown in FIG. 12B. In block 1220A a determination is made to see if there are any vertices with costs greater than zero. If there are vertices with costs greater than zero, the algorithm moves to block 1230A where a vertex 'v' with the maximum cost is selected. This vertex 'v' is then moved to the "removed-list" in block 1240A. The algorithm then returns to block 1210A and the processing is continued. If there are no vertices with costs greater than zero in block 1220A, the algorithm moves to block 1250A where all the vertices in the "removed-list" are returned. The algorithm finally stops in 1260A.

Flowchart shown in FIG. 12B represents the algorithm used for updating costs. In block 1210B the costs associated with each vertex is initialized to zero. In block 1220B the out-degrees for all vertices are computed. In block 1230B all the in-degree vertices for all vertices are identified. In block 1240B the algorithm enters a loop. If there are any more vertices left to update costs, the algorithm proceeds to block 1280B where it returns back to algorithm in FIG. 12A. In block 1241B a vertex 'v' is selected. In block 1250B a determination is made whether the out-degree for 'v' is greater than 1. If it is greater than 1 the cost for vertex 'v' is equalized to out-degree minus 1 in block 1251B. If not the algorithm proceeds to step 1260B. In block 1260B, a determination is made to see if there are more in-degree vertices for 'v' to be processed. If there are more in-degree vertices, a vertex 'w' which is an in-degree vertex of 'v' is selected in 1261B. In block 1270B a determination is made if out-degree for 'w' is greater than 1. If its out-degree is greater than 1 the cost for vertex 'v' is increased by 1 in block 1271B and the algorithm returns to block 1260B. If the out-degree is not greater than 1 in 1270B the algorithm returns to 1260B.

The scan flip-flop selection technique according to the invention is preferably implemented in a C language program.

IVF. Experimental Results

Experimentally were conducted using the larger ISCAS 89 sequential benchmark circuits. All experiments were performed on a SUN UltraSparc workstation. A sequential circuit test generator that is comparable in performance to several commercially available sequential test generators were used.

FIG. 14 depicts a table showing the area overhead incurred by several partial scan proposals including the present technique. The area overhead figures for the proposed technique are compared with two other prior art techniques: one that selects flip-flops to break all feedback cycles except self-loops (self-loop acyclic) and one that selects flip-flops to break all feedback cycles including self-loops (pipeline). For the scan selection technique of the present invention, two sets of circuits were generated.

The first set SD1 is obtained by using both peripheral partitioning and tree decomposition. The second set SD2 is obtained by using only peripheral partitioning. Scan selection for the set SD1 not only include all scan flip-flops in the set SD2, but may have additional scan flip-flops. Therefore, scan circuits of the set SD2 have a lower scan overhead than the scan circuits of set SD1. However, the overhead figures for both SD1 and SD2 scan circuits are significantly lower when compared with the pipeline case. This preferred embodiment entails scanning about 20–40% of flip-flops in the larger designs as compared to the pipeline case that may require as high as 75% or more. When compared to the self-loop acyclic case, the present invention has higher area overhead. However, as shown in FIG. 13, high fault efficiencies are not achievable for the self-loop acyclic case. The CPU seconds required for selecting scan flip-flops is quite low even for the large circuits.

FIG. 14 depicts a table showing test generation results for the pipeline case. High fault efficiencies are achieved for all circuits, including the larger ones, with very short CPU times. Column TAT shows the normalized test application time, as compared to the test application time required for circuits in the SD1 set. These results show that the proposed peripheral partitioning and tree decomposition method produces circuits that not only have lower area overhead, but also require significantly lower test application times.

Test generation results for the SD1 and SD2 cases are shown in tables shown in FIGS. 15 and 16, respectively.

The maximum number of flip-flops in any partition (Max P), maximum sequential depth for any partition (Max D) and the maximum number of vectors in a test sequence for any fault (Max T) are shown. The maximum sequential depth of any partition in the SD2 case will always be more than the corresponding number for the SD1 case.

High (near 100%) fault efficiencies are achieved for both cases comparable to the pipeline case. The test application times for the both these case are also lower than the pipeline case. Further, the test application time for the SD2 case is typically lower than the SD1 case.

The current invention is also compared to a circuit partitioning technique suggested by T. Ono et al. See the present technique incurs lower area overhead and achieves significantly higher fault efficiencies with lower CPU resources. For example, consider the circuit s13207. The present invention selects only 142 flip-flops (SD2 case). 99% fault efficiency is achieved in only 508 CPU seconds. In comparison, the prior art technique selects 217 flip-flops and achieves a fault efficiency of only 60.8% in about 7564 CPU seconds. The improvement in area overhead, fault efficiency and test generation CPU times is more pronounced for larger circuits.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A partial scan system for sequential circuits comprising:
    an input unit, that receives a description of the sequential circuits;
    a peripheral partitioning unit, that peripherally partitions the sequential circuits received by the input unit;
    a tree decomposition unit, that performs tree decomposition on the sequential circuits received by the input unit;
    a circuit redesign unit, that redesigns the sequential circuits based on outputs of the peripheral partitioning unit and tree decomposition unit; and
    an output unit, that outputs a redesigned circuit.

2. A partial scan system according to claim 1, wherein the peripheral partitioning unit partitions a sequential circuit into peripheral partitions.

3. A partial scan system according to claim 1, wherein the tree decomposition unit decomposes an S-graph of a sequential circuit into trees.

4. A computer program product comprising, computer readable instructions and a computer medium bearing said computer readable instructions;

said instructions being adaptable to enable a computer to operate according to the steps of:
        receiving a sequential circuit from the user;
        peripheral partitioning the sequential circuit to form a partial scanned circuit;
        checking if tree decomposition can be performed on the partial scanned circuit;
        performing tree decomposition on the sequential circuit, if tree decompositioning can be performed, to form a refined partial scanned circuit; and
        returning the refined partial scanned circuit to the user.

5. A computer program product according to claim 4, wherein the computer readable instructions are in C programming language.

6. A computer program product comprising, computer readable instructions and a computer medium bearing said computer readable instructions;

said instructions being adaptable to enable a computer to operate according to the steps of:
        receiving a sequential circuit from the user;
        checking if tree decomposition can be performed on the sequential circuit;
        performing tree decomposition on the sequential circuit, if tree decomposition can be performed, to form a partial scanned circuit;

not have a combinational path to another memory element not belonging to said group of memory elements.

7. A computer program product according to claim 6, wherein the computer readable instructions are in C programming language.

\* \* \* \* \*

UNITED STATES PATENT AND TRADEMARK OFFICE
CERTIFICATE OF CORRECTION

PATENT NO. : 6,134,687  
DATED : October 17, 2000  
INVENTOR(S) : Arun Balakrishnan, Srimat T. Chakradhar It is certified that error appears in the above-identified patent and that said Letters Patent is hereby corrected as shown below:

<u>Column 14, claim 6,</u>
Delete lines 12 and 13 "not..... elements" insert -- peripheral partitioning the partial scanned circuit to form a refined partial scanned circuit returning the refined partial scanned circuit to the user. --

Signed and Sealed this

Twentieth Day of November, 2001

*Attest:*

NICHOLAS P. GODICI  
*Acting Director of the United States Patent and Trademark Office*

*Attesting Officer*